United States Patent
Mabuchi et al.

(10) Patent No.: US 6,730,942 B2
(45) Date of Patent: May 4, 2004

(54) LIGHT EMITTING APPARATUS

(75) Inventors: Akira Mabuchi, Aichi-ken (JP);
Masato Kawamura, Aichi-ken (JP);
Kanae Matsumura, Aichi-ken (JP);
Takemasa Yasukawa, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/349,165

(22) Filed: Jan. 23, 2003

(65) Prior Publication Data
US 2003/0168652 A1 Sep. 11, 2003

(30) Foreign Application Priority Data

Jan. 24, 2002 (JP) ........................ 2002-016181
Jan. 24, 2002 (JP) ........................ 2002-016182

(51) Int. Cl.$^7$ ............................................. H01L 29/24
(52) U.S. Cl. ........................ 257/100; 257/788; 313/512
(58) Field of Search ................. 257/100, 787, 257/788, 793; 313/512, 498, 499; 549/540, 560; 525/338, 339, 332.1

(56) References Cited

U.S. PATENT DOCUMENTS

| 6,060,611 A | 5/2000 | Hara et al. |
| 6,617,787 B2 * | 9/2003 | Kato et al. .................. 313/512 |
| 2001/0008484 A1 | 7/2001 | Kato et al. |

FOREIGN PATENT DOCUMENTS

| JP | 11-199645 | 7/1999 |
| JP | 11-274571 | 10/1999 |
| JP | 2001-196642 | 7/2001 |
| JP | 2003-13001 | * 1/2003 |

* cited by examiner

Primary Examiner—Sara Crane
(74) Attorney, Agent, or Firm—McGinn & Gibb, PLLC

(57) ABSTRACT

A sealing member for a short-wavelength light emitting element comprises a main agent and a curing agent. The main agent comprises a first component of an alicyclic epoxy produced by hydrogenating an aromatic epoxy, preferably a bisphenol A epoxy, and a second component of an alicyclic epoxy having a lower molecular weight than the first component. The mixing amount of the second component is not less than 10% by weight and less than 30% by weight based on the main agent.

20 Claims, 8 Drawing Sheets

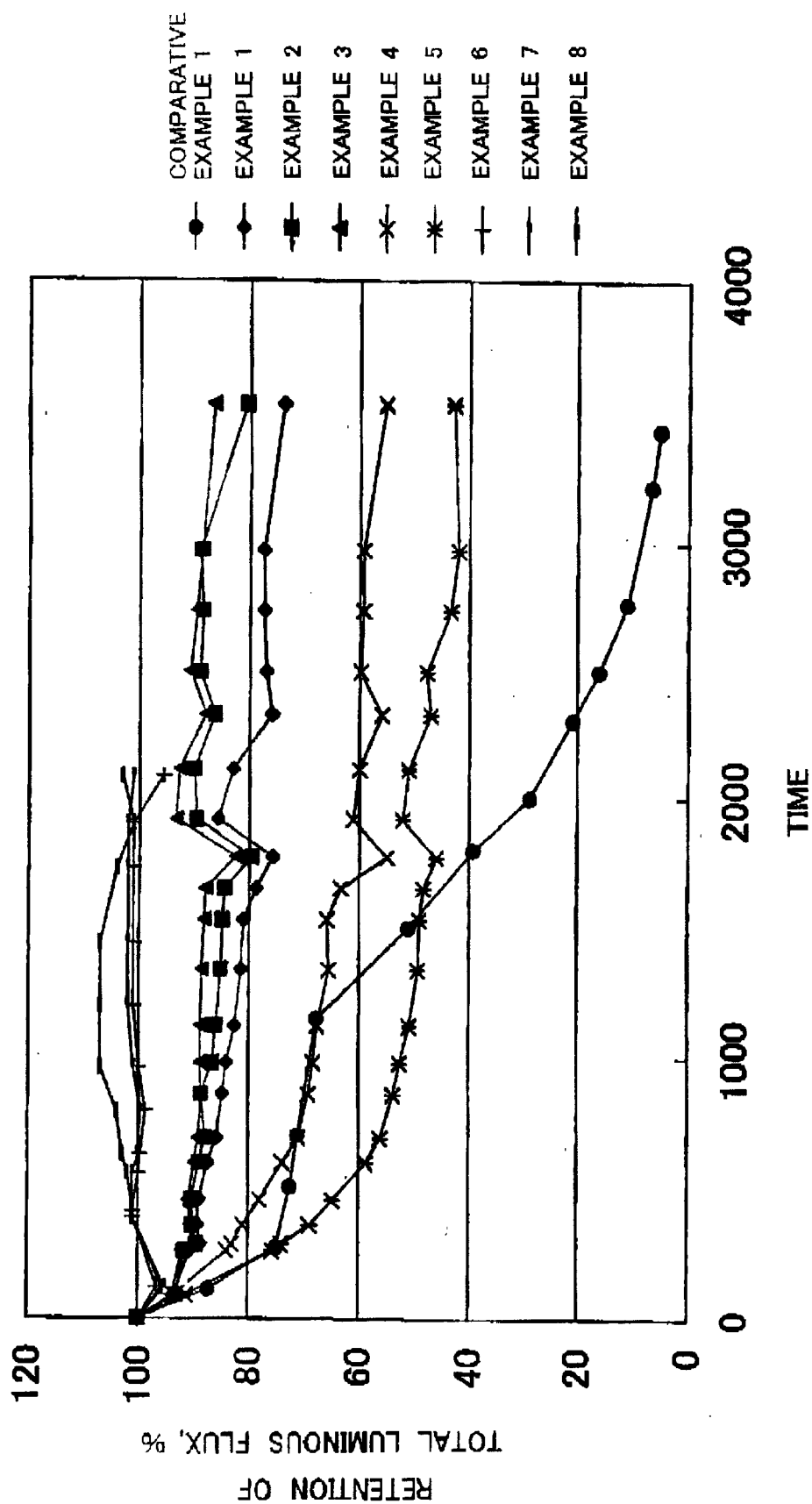

FIG. 4

| | Chemical structure | Tradename | Comp. Ex. 1 | Ex. 1 | Ex. 2 | Ex. 3 | Ex. 4 | Ex. 5 | Ex. 6 | Ex. 7 | Ex. 8 |
|---|---|---|---|---|---|---|---|---|---|---|---|
| Main agent | Bisphenol A epoxy | Epikote 828 EL (n = 0.1) | 60 | | | | | | | | |
| | Hydrogenated bisphenol A epoxy | Epikote YL 6663 (n = 0.1) | | 80 | 80 | 80 | 80 | 80 | 40 | | |
| | Hydrogenated bisphenol A epoxy | Epikote YL 6834 (n = 0.5) | | | | | | | | 80 | |
| | Alicyclic epoxy | CELLOXIDE C 2021 P | | | | | | | | | 100 |
| Catalyst | | PXE-4ET | 40 | 20 | 20 | 20 | 20 | 20 | 40 | 20 | |
| Curing agent | Hexahydrophthalic anhydride | Rikacid MH 700 G | 100 | 1 | 1 | 1 | 1 | 1 | 20 | 1 | 1 |
| | | | | 87.5 | 87.5 | 87.5 | 87.5 | 87.5 | 1 | 64.5 | 57.5 |
| | | | | | | | | | 74.5 | | |
| Stabilizer | Phenolic antioxidant | BHT | 0.1 | 0 | 0.1 | 0.2 | 2 | 4 | 0.2 | 0.2 | 0.2 |
| | Phosphoric antioxidant | EPC | 0.1 | 0 | 0.1 | 0.2 | 2 | 4 | 0.2 | 0.2 | 0.2 |
| Mixing ratio | | Main agent/curing agent | 100/100 | 100/86.6 | 100/86.5 | 100/86.3 | 100/83.3 | 100/80.3 | 100/74 | 100/64 | 100/57 |
| Mechanical strength | Izod impact strength | kg-cm/cm | 4 | | | | | | | | |
| | Heat distortion temp. | °C | 150 | | | | | | | 111 | 106 |
| | Glass transition temp. | °C | 145 | | | | | | | | |

FIG.6

| | Chemical structure | Tradename | Ex. 6 | Ex. 7 | Ex. 8 | Ex. 9 | Ex. 10 | Ex. 11 |
|---|---|---|---|---|---|---|---|---|
| Main agent | Hydrogenated bisphenol A epoxy | Epikote YL 6663 | 40 | | | 40 | | |
| | Hydrogenated bisphenol A epoxy | Epikote YL 6834 | 40 | 80 | 100 | 40 | 80 | 100 |
| | Alicyclic epoxy | CELLOXIDE C 2021 P | 20 | 20 | | 20 | 20 | |
| Catalyst | | PXE-4ET | 1 | 1 | 1 | 1 | 1 | 1 |
| Curing agent | Hexahydrophthalic anhydride | Rikacid MH 700G | 74.5 | 64.9 | 57.5 | 74.5 | 64.9 | 57.5 |
| Stabilizer | Phenolic | BHT | 0.2 | 0.2 | 0.2 | 0 | 0 | 0 |
| | Phosphoric | HCA | 0.2 | 0.2 | 0.2 | 0 | 0 | 0 |

FIG.8

|  |  | Chemical structure | Tradename | Comp. Ex. 2 | Ex. 12 | Ex. 13 | Ex. 14 | Ex. 15 | Ex. 16 | Ex. 17 | Ex. 18 |
|---|---|---|---|---|---|---|---|---|---|---|---|
| Main agent | | Bisphenol A epoxy | Epikote 828 EL (n=0.1) | 60 | | | | | | | |
| | | Hydrogenated bisphenol A epoxy | Epikote YL 6663 (n=0.1) | | 80 | 80 | 80 | 80 | 80 | 80 | 80 |
| | | Alicyclic epoxy | CELLOXIDE C 2021 P | 40 | 20 | 20 | 20 | 20 | 20 | 20 | 20 |
| Catalyst | | Sulphonium salt | YLH935 | 0.5 | 0.5 | 0.5 | 0.5 | 0.5 | 0.5 | 0.5 | 0.5 |
| Stabilizer | | Phenolic antioxidant | BHT | 0.1 | 0 | 0.05 | 0.1 | 1 | 2 | 2 | |
| | | Phosphoric antioxidant | BPC | 0.1 | 0 | 0.05 | 0.1 | 1 | 2 | | 2 |
| Mechanical Strength | | Izod impact strength | kg-cm/cm | 4 | | 2 | | | | 2 | 2 |
| | | Heat distortion temp. | °C | 150 | | 92 | | | | | |
| | | Glass transition temp. | °C | 145 | | 89 | | | | | |

LIGHT EMITTING APPARATUS

The present application is based on Japanese Patent Applications No. 2002-016181 and No. 2002-016182, the entire contents of which are incorporated herein by reference.

BACKGROUND OF THE INVENTION

1. Field of the Invention

This invention relates to a light emitting apparatus. More particularly, the invention relates to an improvement in a sealing member for a light emitting apparatus using a group III nitride compound semiconductor light emitting element (hereinafter referred to simply as "light emitting element," such as LED, as a light source.

2. Related Art

In conventional light emitting apparatuses, an LED is mounted on a cup part in a mount lead, and the LED is connected to an inner lead through an electrically conductive wire. The LED is covered, together with the electrically conductive wire, a part of the mount lead, and a part of the inner lead, with a sealing member formed of a light transparent resin.

In the light emitting apparatuses having the above construction, it is common practice to form the sealing member using a transparent epoxy resin. When light emitting elements, which emit short-wavelength light, are used with the epoxy resin as the sealing member, a change in color (discoloration) of the sealing member occurs. This color change has been estimated to be attributable to a double bond in the epoxy resin, and, to solve this problem, the use of an alicyclic epoxy resin has been proposed in Japanese Patent Laid-Open No. 274571/1999.

The use of the alicyclic epoxy resin can certainly improve the resistance to discoloration of the sealing member. The alicyclic epoxy resin, however, causes a deterioration in mechanical and physical properties of the sealing member, for example, due to very high curing speed and the occurrence of distortion after curing, resulting in increased susceptibility to cracking of the sealing member.

In view of these points, the present applicant has proposed in Japanese Patent Laid-Open No. 196642/2001 the use, as the sealing member, of a hydrogenated epoxy resin produced by hydrogenating an aromatic epoxy resin. This hydrogenated epoxy resin has a hydrogenation ratio in an aromatic ring of not less than 85%, a loss ratio of epoxy groups of not more than 20%, and a total chlorine content of not more than 0.3% by weight.

It is an object of the invention to provide a sealing member which, while ensuring resistance to discoloration and resistance to cracking comparable to those in the invention described in Japanese Patent Laid-Open No. 196642/2001, has a novel composition provided by improving the technique described in the prior application.

Further, in view of the fact that the discoloration of the sealing member is considered attributable to short-wavelength light emitted from the light emitting element, as well as to heat generated from the light emitting element, it is another object of the invention to provide a sealing member which possesses excellent heat resistance in addition to the resistance to discoloration and the resistance to cracking.

SUMMARY OF THE INVENTION

The present inventors have made extensive and intensive studies on the relationship between a light emitting element of a group III nitride compound semiconductor and an epoxy resin. As a result, they have found that a mixture of an alicyclic epoxy produced by hydrogenating an aromatic epoxy and an alicyclic epoxy having a lower molecular weight than the alicyclic epoxy described just above in a given mixing ratio can provide a sealing member which has high resistance to light and heat and is less likely to be deteriorated. The invention has been made based on such finding and has the following construction.

Specifically, according to the invention, there is provided a light emitting apparatus comprising:

a group III nitride compound semiconductor light emitting element; and a sealing member for covering the light emitting element on its light emission side, said sealing member comprising:

a main agent comprising a first component of an alicyclic epoxy produced by hydrogenating an aromatic epoxy and a second component of an alicyclic epoxy having a lower molecular weight than the first component, the mixing amount of the second component being not less than 10% by weight and less than 30% by weight based on the main agent, and a curing agent.

According to the light emitting apparatus having the above construction, when a mixture of the first component and the second component in a predetermined ratio is used as the main agent of the sealing member, excellent mechanical and physical properties can be ensured while maintaining the resistance to discoloration of the sealing member.

In carrying out our invention in one preferred mode, when the acid anhydride is selected as the curing agent, the sealing member can be of two-component type before curing. This can improve working properties particularly at the time of molding of the sealing member. Consequently, the light emitting apparatus can be provided at low price.

Further, in another preferred mode, when the cationic polymerization catalyst is selected as the curing agent, the sealing member can be of one-component type before curing. This is suitable for use of the epoxy resin as an adhesive (a, paste) for bonding the light emitting element, for example, to, a lead frame.

BRIEF DESCRIPTION OF THE DRAWINGS

The invention will be explained in more detail in conjunction with the appended drawings, wherein:

FIG. 3 is a graph showing a change in retention of the total luminous flux over time in Examples 1 to 8 of the invention and Comparative Example 1;

FIG. 4 is a diagram showing a table of formulations in Examples 1 to 8 and Comparative Example 1;

FIG. 6 is a diagram showing a table of formulations in Examples 6 to 11 of the invention;

FIG. 8 is a diagram showing a table of formulations in Examples 12 to 18 and Comparative Example 2.

DESCRIPTION OF THE PREFERRED EMBODIMENTS

Figure 1:
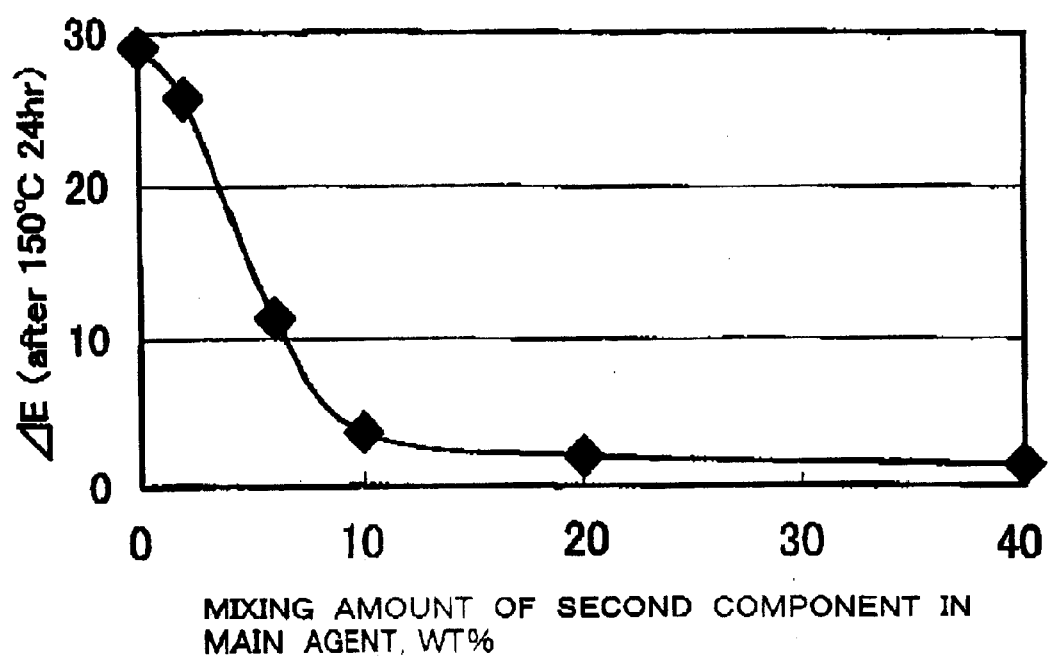
FIG. 1 is a graph showing the relationship of the mixing ratio, between the first component and the second component in the main agent, to the discoloration resistance.

Individual constituent elements of the invention will be explained in detail.

First Component in Main Agent

An epoxy resin proposed in Japanese Patent Laid-Open No. 199645/1999 may be used as the first component of an alicyclic epoxy produced by hydrogenating an aromatic epoxy resin. This epoxy resin is a hydrogenated epoxy resin which has been produced by hydrogenating an aromatic epoxy resin and has a hydrogenation ratio in an aromatic ring of not less than 85%, a loss ratio of epoxy groups of not more than 20%, and a total chlorine content of not more than 0.3% by weight.

Studies conducted by the present inventors have revealed that, as the aromatic epoxy resin, a bisphenol A epoxy is more preferred than a bisphenol F epoxy. One possible reason for this is that, in many cases, it is difficult to wholly hydrogenize benzene rings in the aromatic epoxy, and, when benzene rings have remained unhydrogenized, the F type, in which group —$CH_2$— is sandwiched between benzene rings, undergoes the elimination of H more easily than the A type in which group —$C(CH_3)_2$— is sandwiched between benzene rings to form a quinoid structure.

A hydrogenation product of the bisphenol A epoxy is as follows.

[Chemical formula 1]

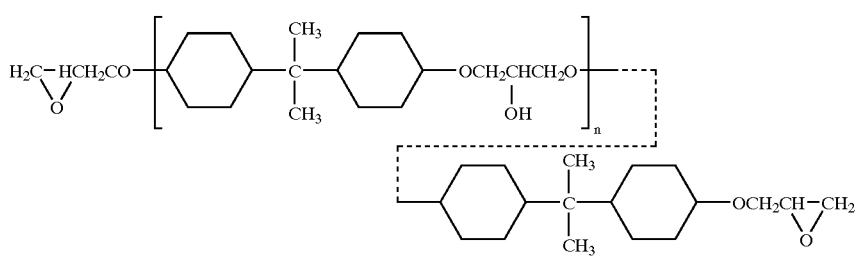

Japanese Patent Laid-Open No. 199645/1999 in its portions relevant to the invention will be quoted in this paragraph for clarifying the disclosure of the invention.

(1) The invention relates to an epoxy resin composition containing (A) a hydrogenated epoxy resin produced by hydrogenation of an aromatic epoxy resin in which the hydrogenated epoxy resin has a hydrogenation ratio in an aromatic ring of not less than 85%, a loss ratio of epoxy groups of not more than 20%, and a total chlorine content of not more than 0.3% by weight, and (B) a curing agent for the epoxy resin.

(2) The invention relates to an epoxy resin composition, wherein, in the epoxy resin composition according to the above item (1), 0.01 to 200 parts by weight of a curing agent for the epoxy resin is mixed with 100 parts by weight of the hydrogenated epoxy resin.

(3) The invention relates to an epoxy resin composition, wherein, in the epoxy resin composition according to the above item (1) or (2), the hydrogenated epoxy resin is produced by dissolving an aromatic epoxy resin in an ether solvent to prepare a solution and subjecting the solution to hydrogenation under pressure in the presence of a catalyst comprising rhodium or ruthenium supported on graphite.

(4) The invention relates to an epoxy resin composition, wherein, in the epoxy resin composition according to any one of the above items (1) to (3), the hydrogenated epoxy resin is a liquid epoxy resin which is produced by hydrogenating a bisphenol A epoxy resin and which has a viscosity of not more than 2.5 Pa.s as measured at 25° C. with a rotating viscometer.

(5) The invention relates to an epoxy resin composition, wherein, in the epoxy resin composition according to any one of the above items (1) to (3), the hydrogenated epoxy resin is produced by hydrogenating a novolak type epoxy resin having an epoxy equivalent in the range of 150 to 230 and represented by the following chemical formulas 2–3.

[Chemical formula 2]

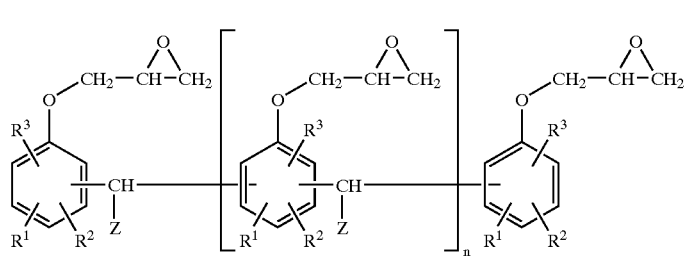

wherein $R^1$, $R^2$, and $R^3$ represent a hydrogen atom or an alkyl group having 1 to 4 carbon atoms; n is a number of 0 to 10; and Z represents a hydrogen atom or formula

[Chemical formula 3]

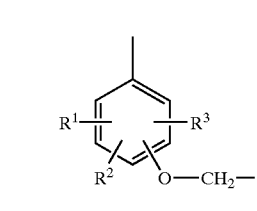

wherein $R^1$, $R^2$, and $R^3$ represent a hydrogen atom or an alkyl group having 1 to 4 carbon atoms.

(6) The invention relates to an epoxy resin composition, wherein, in the epoxy resin composition according to any one of the above items (1) to (5) the hydrogenated epoxy resin has a total chlorine content of not more than 0.3% by weight and a hydrolyzable chlorine content of not more than 0.1% by weight.

(7) The invention relates to an epoxy resin composition, wherein, in the epoxy resin composition according to any one of the above items (1) to (6), the curing agent for the epoxy resin is a compound selected from amines, acid anhydrides, polyhydric phenols, imidazoles, salts of Brønsted acids, dicyandiamides, hydrazides of an organic acid, polymercaptans, and organic phosphines.

(8) The invention relates to an epoxy resin composition, wherein, in the epoxy resin composition according to any one of the above items (1) to (7), the curing agent for the epoxy resin is such that not more than 10% by weight of the whole curing agent is accounted for by an aromatic ring.

The invention of this application will be explained in more detail.

Component (A): Hydrogenated Epoxy Resin

The hydrogenated epoxy resin as the component (A) in the invention is produced by hydrogenating an aromatic epoxy resin in which the hydrogenated epoxy resin has a hydrogenation ratio in an aromatic ring of not less than 85%, a lose ratio of epoxy groups of not more than 20%, and a total chlorine content of not more than 0.3% by weight. The hydrogenation ratio in the aromatic ring in the epoxy resin refers to the proportion of the aromatic ring which has been converted to an aliphatic ring and can be determined by nuclear magnetic resonance analysis. The loss ratio of epoxy groups refers to the proportion of epoxy groups which have been hydrogenated and can be determined by titration with perchloric acid. The total chlorine refers to the total amount of organic chlorines and inorganic chlorines contained in the epoxy resin and can be determined by reacting chlorine in the epoxy resin with sodium biphenyl and then titrating the reaction product with silver nitrate.

The content of hydrolyzable chlorine in the hydrogenated epoxy resin as the component (A) is preferably not more than 0.1% by weight for use in sealing material applications in electronic components. When the hydrogenation ratio of an aromatic ring is less than 85%, the weather resistance of the cured product of the epoxy resin is extremely and disadvantageously deteriorated. When the loss ratio of epoxy groups exceeds 20%, the heat resistance of the cured product of the epoxy resin is extremely and disadvantageously deteriorated. Further, when the total chlorine content exceeds 0.3% by weight, the moisture resistance, electrical characteristics at high temperatures, and weather resistance are deteriorated. Therefore, in this case, the hydrogenated epoxy resin is unsuitable for use as an epoxy resin for electrical and electronic materials.

A Method for Producing Hydrogenated Epoxy Resin

The hydrogenated epoxy resin as the component (A) in the invention can be produced by selectively hydrogenating an aromatic epoxy resin under pressure in the presence of a catalyst. Examples of aromatic epoxy resins include: bisphenol epoxy resins such as diglycidyl ether of bisphenol A, diglycidyl ether of bisphenol F, and diglycidyl ether of bisphenol S; novolak epoxy resins such as phenol novolak epoxy, cresol novolak epoxy, and hydroxybenzaldehyde phenol novolak epoxy; and polyfunctional epoxy resins such as glycidyl ether of tetrahydroxyphenylmethane, glycidyl ether of tetrahydroxybenzophenone, and epoxidized polyvinylphenol.

Among them, bisphenol A epoxy resin and novolak epoxy resin represented by the following chemical formulas 2–3 are preferred from the viewpoint of low chlorine content:

[Chemical formula 2]

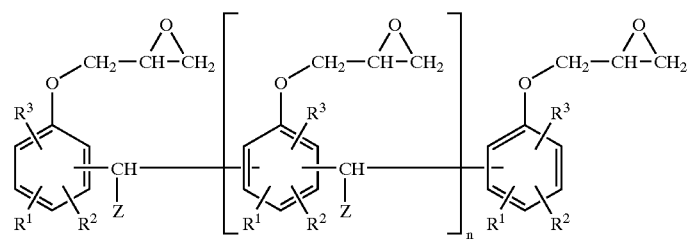

wherein $R^1$, $R^2$, and $R^3$ represent a hydrogen atom or an alkyl group having 1 to 4 carbon atoms; n is a number of 0 to 10; and Z represents a hydrogen atom or formula

[Chemical formula 3]

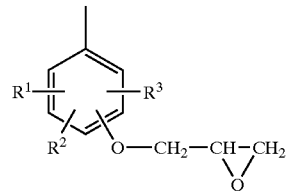

wherein $R^1$, $R^2$, and $R^3$ represent a hydrogen atom or an alkyl group having 1 to 4 carbon atoms.

For applications where a balance between heat resistance and moisture resistance is particularly required, more preferred are a hydrogenated bisphenol A epoxy resin having a viscosity of not more than 2.5 Pa.s as measured at 25° C. with a rotating vicometer and a novolak epoxy resin represented by the general formula (1), particularly an epoxy resin produced by hydrogenating an aromatic epoxy resin wherein $R^1$, $R^2$, and $R^3$ represent a hydrogen atom or a methyl group and which has an epoxy equivalent of 150 to 230.

The hydrogenated epoxy resin as the component (A) in the invention is produced by selectively hydrogenating an aromatic ring in an ether-based organic solvent, such as tetrahydrofran or dioxane, in the presence of a catalyst comprising rhodium or ruthenium supported on graphite (hexagonal crystalline graphite). The graphite as the support (carrier) has a surface area in the range of not less than 10 $m^2/g$ to not more than 400 $m^2/g$. The reaction is carried out under conditions of pressure 1 to 30 MPa, temperature 30 to 150° C., and reaction time 1 to 20 hr. After the completion of the reaction, the catalyst is removed by filtration, and the ether-based organic solvent is removed by distillation under reduced pressure until the ether-based organic solvent is substantially entirely absent in the system, whereby hydrogenated epoxy resin is produced.

Component (B): Curing Agent for Epoxy Resin

The hydrogenated epoxy resin as the component (A) in the invention can be cured with a curing agent for an epoxy resin. Curing agents for the epoxy resin as the component (B) usable in the invention include conventional curing agents for epoxy resins, for example, ① amines: aliphatic and alicyclic amines such as diethylenetriamine, triethylenetetramine, tetraethylenepentamine, N-aminoethylpiperazine, isophoronediamine, bis(4-aminocyclohexyl)methane, bis(aminemethyl) cyclohexane, m-xylylenediamine, and 3,9-bis(3-aminopropyl)-2,4,8,10-tetraspiro[5,5]undecane; aromatic amines such as metaphenylenediamine, diaminodiphenylmethane, and diaminodiphenylsulfone; and tertiary amines such as benzyldimethylamine, 2,4,6-tris(dimethylaminomethyl)phenol, 1,8-diazabicyclo(5,4,0) undecene-7,1,5-diazabicyclo(4,3,0)nonene-5, and salts thereof, ② acid anhydrides: aromatic acid anhydrides such as phthalic anhydride, trimellitic anhydride, and pyromellitic anhydride; and alicyclic acid anhydrides such as tetrahydrophthalic anhydride, methyltetrahydrophthalic anhydride, hexahydrophthalic anhydride, methylhexahydrophthalic anhydride, methylenedomethylene tetrahydrophthalic anhydride, dodecenylsuccinic anhydride, and trialkyltetrahydrophthalic anhydride, ③ polyhydric phenols: catechol, resorcin, hydroquinone, bisphenol F, bisphenol A, bisphenol S, bisphenol, phenol novolaks, cresol novolaks, novolak compounds of a divalent phenol such as bisphenol A, trishydroxyphenyl methanes, aralkyl polyphenols, dicyclopentadiene polyphenols and the like, ④ polyaminoamides: polyaminoamides produced by a condensation reaction of the amines in the above item ① with a dimer acid, for example, Versamides (tradename) 140 and 125 (grade name) manufactured by Henkel, Ltd. and the like, and ⑤ others: imidazole compounds such as 2-methylimidazole, 2-ethyl-4-imidazole, and 2-phenylimidazole and salts of these imidazole compounds; $BF_3$ complex compounds of amines; salts of Brønsted acids, such as aliphatic sulphonium salts and aromatic sulfonium salts; dicyandiamides; hydrazides of organic acids, such as adipic acid dihydrazide and phthalic acid dihydrazide; and organic phosphine compounds such as polymercaptans and triphenylphosphine; and the like.

These curing agents for epoxy resins may be used solely or as a combination of two or more of them.

The curing agent for an epoxy resin is preferably used in such an amount that not more than 10% by weight of the whole curing agent is accounted for by the aromatic ring. When the content of the aromatic ring exceeds 10% by weight, the weather resistance of the cured product of the epoxy is disadvantageously deteriorated. The mixing ratio between the hydrogenated epoxy resin as the component (A) and the curing agent for an epoxy resin as the component (B) is such that the amount of the curing agent for an epoxy resin as the component (B) is 0.01 to 200 parts by weight, preferably 0.1 to 150 parts by weight, based on 100 parts by weight of the hydrogenated epoxy resin as the component (A). When the mixing, ratio is outside the above-defined range, the balance between heat resistance and moisture resistance of the cured product of epoxy resin is disadvantageously deteriorated.

Optional Components

The following components may be optionally mixed as additives into the epoxy resin composition of the invention.

① Powdered reinforcing materials and filters, for example, metal oxides such as aluminum oxide and magnesium oxide, metal carbonates such as calcium carbonate and magnesium carbonate, silicon, compounds such as powdered diatomaceous earth, basic magnesium silicate, calcined clay, finely divided silica, fused silica, and crystalline silica, metal hydroxides such as aluminum hydroxide, and other materials such as kaolin, mica, powdered quartz, graphite, molybdenum disulfide, etc., and, further, fibrous reinforcing materials and fillers, for example, glass fibers, ceramic fibers, carbon fibers, alumina fibers, silicon carbide fibers, boron fibers, polyester fibers, polyamide fibers, etc. They may be mixed, into the epoxy resin composition, in an amount of 10 to 900 parts by weight based on 100 parts by weight in total of the epoxy resin and the curing agent.

② Colorants, pigments, flame retardants, for example, titanium dioxide, iron black, molybdenum red, iron blue, ultramarine blue, cadmium yellow, cadmium red, antimony trioxide, red phosphorus, brominated compounds, triphenyl phosphate, etc. They may be mixed, into the epoxy resin composition, in an amount of 0.1 to 20 parts by weight based on 100 parts by weight in total of the epoxy resin and the curing agent.

③ Further, various curable monomers, oligomers, and synthetic resins may be mixed for improving the properties of resins in final coatings, adhesive layers, molded products and the like. For example, one of or a combination of two or more diluents for epoxy resins such as monoepoxy resins, phenol resins, alkyd resins, melamine resins, fluororesins, vinyl chloride resins, acrylic resins, silicone resins, polyester resins and the like may be used. The mixing ratio of these resins is preferably such that properties inherent in the resin composition of the invention are not sacrificed, that is, the amount of the above resins is not more than 50 parts by weight based on 100 parts by weight in total of the epoxy resin and the curing agent. According to the invention, means usable for mixing the epoxy resin, the curing agent for an epoxy resin, and optional components include melt mixing with heating, melt kneading by means of a roller or a kneader, wet mixing using a suitable organic solvent, and dry mixing.

Second Component in Main Agent

The alicyclic epoxy as the second component has a lower molecular weight than the alicyclic epoxy as the first component produced by hydrogenating an aromatic epoxy.

The alicyclic epoxy as the second component having a lower molecular weight acts to crosslink the alicyclic epoxy as the first component, thereby improving the heat resistance of the epoxy resin. As a result, discoloration resistance is improved. Further, mechanical and physical properties of the sealing member, that is, cracking resistance, can be improved.

The alicyclic epoxy as the second component is preferably one containing an epoxycyclohexenyl group, for example, 3,4-epoxycyclohexenylmethyl 3',4'-epoxycyclohexenecarboxylate (see chemical formula 4).

[Chemical formula 4]

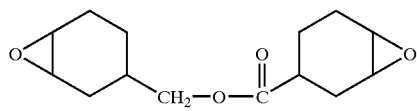

Mixing Ratio between First Component and Second Component

The mixing ratio between the first component and the second component is preferably such that the content of the second component in the main agent is not less than 10% by weight and less than 30% by weight.

As shown in FIG. 1, when the mixing ratio of the second component is less than 10% by weight, the resistance to discoloration is unsatisfactory. On the other hand, when the mixing ratio of the second component is excessively high, the cracking resistance is unsatisfactory. For the above reason, in the invention, the upper limit of the mixing ratio of the second component is less than 30% by weight.

FIG. 1 shows the relationship of the mixing ratio, between the first component (tradename; Epikote YL 6663, manufactured by Japan Epoxy Resins Co., Ltd.) and the second component (tradename: CELLOXIDE 2021 P, manufactured by Daicel, Chemical Industries, Ltd.) (see abscissa), to the level of change in total luminous flux (total quantity of light emitted from LED) after a high-temperature accelerated test (150° C., 24 hr) (see ordinate).

The mixing ratio between the first component and the second component is more preferably such that the content of the second component in the main agent is not less than 10% by weight and not more than 25% by weight, still more preferably not less than 10% by weight and less than 20% by weight.

Curing Agent

In one preferred mode of this invention, an acid anhydride is adopted as the curing agent.

The acid anhydride used as the curing agent preferably does not contain any double bond in its structure from the viewpoint of preventing the discoloration of the curing agent per se.

Curing agents include, for example, 4-methylhexahydrophthalic anhydride (chemical formula 5).

[Chemical formula 5]

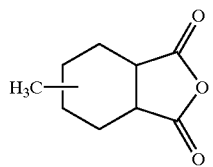

The amount of the acid anhydride as the curing agent mixed is preferably 50 to 120 parts by weight, more preferably 60 to 90 parts by weight, based on 100 parts by weight of the main agent.

In another preferred mode of this invention, a cationic polymerization catalyst is used as the curing agent. When the cationic polymerization catalyst is used, preferably, suitable antioxidant and/or photostabilizer are selected and mixed into the cationic polymerization catalyst to minimize the discoloration of the epoxy resin.

The use of the cationic polymerization catalyst causes the cleavage of epoxy rings, and the cleaved epoxy groups are reacted with each other to form an ether linkage. In general, the cationic polymerization catalyst has neither activated species nor functional species. Therefore, even when the cationic polymerization catalyst stays in the epoxy resin, this catalyst is inert to light emitted from the group III nitride compound semiconductor light emitting element.

Cationic polymerization catalysts of this type usable herein include well-known cationic polymerization catalysts, for example, onium salts, such as sulfonium salts, ammonium salts, and phosphonium salts, and silanol-aluminum complexes. Specific examples thereof include cationic polymerization catalysts described, for example, in Japanese Patent No. 2875479, Japanese Patent Laid-Open Nos. 289611/1990 and 29609/1999.

The use of cationic polymerization catalysts based on sulfonium salts is more preferred.

The amount of the cationic polymerization catalyst mixed varies depending upon the performance of the catalyst. Preferably, however, the cationic polymerization catalyst is mixed in an amount of 0.1 to 5.0% by weight, more preferably 0.5 to 1.5% by weight, based on the epoxy resin.

Other Assistants

Assistants described in the above-described Japanese Patent Laid-Open No. 274571/1999, can of course be used as other assistants in the invention. Further, the present inventors have made studies on assistants with focus on photostabilizers. When the stabilizer contains a benzene ring, the benzene ring absorbs green or blue light. Therefore, when the amount of the benzene ring-containing stabilizer mixed is large, there is a fear of emission efficiency being lowered.

According to studies conducted by the present inventors, when a green or blue light emitting element (main emission wavelength peak: 550 to 420 nm) is used, the amount of the stabilizer mixed is preferably not more than 10% by weight, more preferably 0.1 to 5% by weight, still more preferably about 0.2% by weight, based on the sealing member.

Such stabilizers include phenolic antioxidants such as BHT (dibutylhydroxytoluene) (chemical formula 6).

[Chemical formula 6]

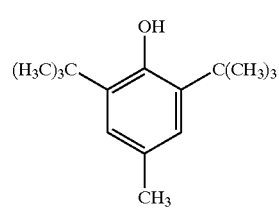

Additional stabilizers include phosphoric photostabilizers such as HCA (chemical formula 7).

[Chemical formula 7]

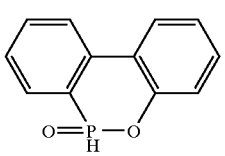

When the light emitting element emits ultraviolet light (main emission wavelength peak: 400 to 360 nm), preferably, the benzene ring-containing stabilizer as represented by chemical formula 6 or chemical formula 7 is not incorporated, because the benzene ring strongly absorbs ultraviolet light resulting in the occurrence of discoloration.

The following phosphors may also be added as additives. Specifically, one or at least two phosphors selected from ZnS:Cu, Au, Al, ZnS:Cu, Al, ZnS:Cu, ZnS:Mn, ZnS:Eu, YVO$_4$:Eu. YVO$_4$:Ce, Y$_2$O$_2$S:Eu, and Y$_2$O$_2$S:Ce may be used. Here ZnS:Cu, Au, Al is a ZnS-based photoluminescence phosphor wherein ZnS is a matrix and has been activated with copper (Cu), gold (Au), and aluminum (Al). ZnS:Cu, Al, ZnS:Cu, ZnS:Mn, and ZnS:Eu are photoluminescence phosphors wherein ZnS is likewise a matrix and has been activated with copper and aluminum for ZnS:Cu, Al, has been activated with copper for ZnS:Cu, has been activated with manganese (Mn) for ZnS:Mn, and has been activated with europium (Eu) for ZnS:Eu. Likewise, YVO$_4$:Eu and YVO$_4$:Ce are phosphors wherein YVO$_4$ is a matrix and has been activated with europium for YVO$_4$:Eu and has been activated with cerium (Ce) for YVO$_4$:Ce, and Y$_2$O$_2$S:Eu and Y$_2$O$_2$S:Ce are phosphors wherein Y$_2$O$_2$S is a matrix and has been activated with europium for Y$_2$O$_2$S:Eu and has been activated with cerium for Y$_2$O$_2$S:Ce. These phosphors have an absorption spectrum for blue to green light and emit light with longer wavelengths than excitation wavelength.

Among the above phosphors, ZnS:Eu, YVO$_4$:Ce, and Y$_2$O$_2$S:Ce, emission wavelength against exciting light of blue to green is longer than that of the other phosphors. That is, colors of light emitted from these phosphors have a higher level of redness than colors of light emitted from the other phosphores. Therefore, light produced by mixing light emitted from these phosphors with light emitted from the light emitting element as a primary light source has a color which is closer to white. Thus, in order to emit light having a color which is closer to white, the use, as the phosphor, of one or at least two members selected from ZnS:Eu, YVO$_4$:Ce, and Y$_2$O$_2$S:Ce is preferred.

CaS:Eu may also be used as the phosphor. This phosphor provides red fluorescence.

Further, cerium-activated yttrium-aluminum-garnet-based phosphors as disclosed in Japanese Patent No. 2927279 may be used. In this case, cerium activation may not have been carried out. In the yttrium-aluminum-garnet-based phosphors, at least one element selected from the group consisting of lutetium (Lu), scandium (Sc), lanthanum (La), gadolinium (Gd), and samarium (Sm) may be substituted for a part or the whole of yttrium, or alternately, any one of or both gallium (Ga) and indium (In) may be substituted for a part or the whole of aluminum. More specifically, the phosphor may be represented by formula (RE$_{1-x}$Sm$_x$)$_3$(Al$_y$Ga$_{1-y}$)$_5$O$_{12}$:Ce wherein $0 \leq x < 1$, $0 \leq y \leq 1$, and RE represents at least one member selected from yttrium (Y) and gadolinium (Gd). In this case, preferably, light emitted from the group III nitride compound semiconductor light emitting element has a peak wavelength at 400 to 530 nm.

Molding of Sealing Member

A light transparent sealing member for surrounding the light emitting element is formed using the epoxy resin produced in this way. The form of the sealing member is not particularly limited. Preferably, however, the sealing member is in a shell form which offers lens effect. The whole part of the sealing member is not necessarily formed of the epoxy resin according to the invention. For example, a construction may also be adopted wherein the light emitting element in its peripheral portion, which is most likely to be deteriorated, is formed of the epoxy resin according to the invention, while the other portion is formed of other light transparent material.

At the time of the production of the sealing member, the curing agent and various assistants may be incorporated in one of or both the main agent and the curing agent.

Group III Nitride Compound Semiconductor

The group III nitride compound semiconductor is represented by general formula Al$_X$Ga$_Y$In$_{1-X-Y}$N, wherein $0 \leq X \leq 1$, $0 \leq Y \leq 1$, and $0 \leq X+Y \leq 1$, and includes the so-called binary compound semiconductors, such as AlN, GaN, and InN, and the so-called ternary compound semiconductors represented by formulae Al$_x$Ga$_{1-x}$N wherein $0<x<1$, Al$_x$In$_{1-x}$N wherein $0<x<1$, and Ga$_x$In$_{1-x}$N wherein $0<x<1$. Boron (B), thallium (Tl), etc. may be substituted for at least a part of the group III element(s). Further, phosphorus (P), arsenic (As), antimony (Sb), bismuth (Bi), etc. may be substituted for at least a part of nitrogen (N). The group III nitride compound semiconductor layer may contain any dopant. n-type impurities usable herein include silicon (Si), germanium (Ge), selenium (Se), tellurium (Te), and carbon (C). p-type impurities usable herein include magnesium (Mg), zinc (Zn), beryllium (Be), calcium (Ca), strontium (Sr), and barium (Ba). After doping with a p-type impurity, the group III nitride compound semiconductor may be exposed to electron beams, plasma, or heat in an oven. This treatment, however, is not indispensable. The group III nitride compound semiconductor layer may be formed by any method without particular limitation, for example, by well-known methods such as metal organic chemical vapor deposition (MOCVD), molecular beam epitaxy (MBE), halide vapor phase epitaxy (HVPE), sputtering, ion plating, and electron shower.

The light emitting element may have a homo structure, a hetero structure, or a double hetero structure. A quantum well structure (a single quantum well structure or a multiple quantum well structure) may also be adopted.

Paste

The paste is an adhesive for fixing the light emitting element to a lead frame or the like. The above-described main agent and curing agent are used as a base, and various assistants are mixed into the base. The addition of a reflective material such as silver can provide a light reflecting paste called "silver paste." The addition of a fluorescent material can realize wavelength conversion of light emitted from the light emitting element.

FIRST EXAMPLES

The construction and the effect in one preferred mode of the invention will be explained in more detail in conjunction with the following examples.

LED having a peak wavelength at about 485 nm provided by TOYODA GOSEI CO, LTD. (applicant) was used as a light emitting element formed of a group III nitride compound semiconductor light emitting element. The LED has the following construction.

| Layer | Composition |
| --- | --- |
| p-type layer | p-GaN:Mg |
| Layer including light emitting layer | Including InGaN layer |
| n-type layer | n-GaN:Si |
| Buffer layer | AlN |
| Substrate | Sapphire |

Figure 2:
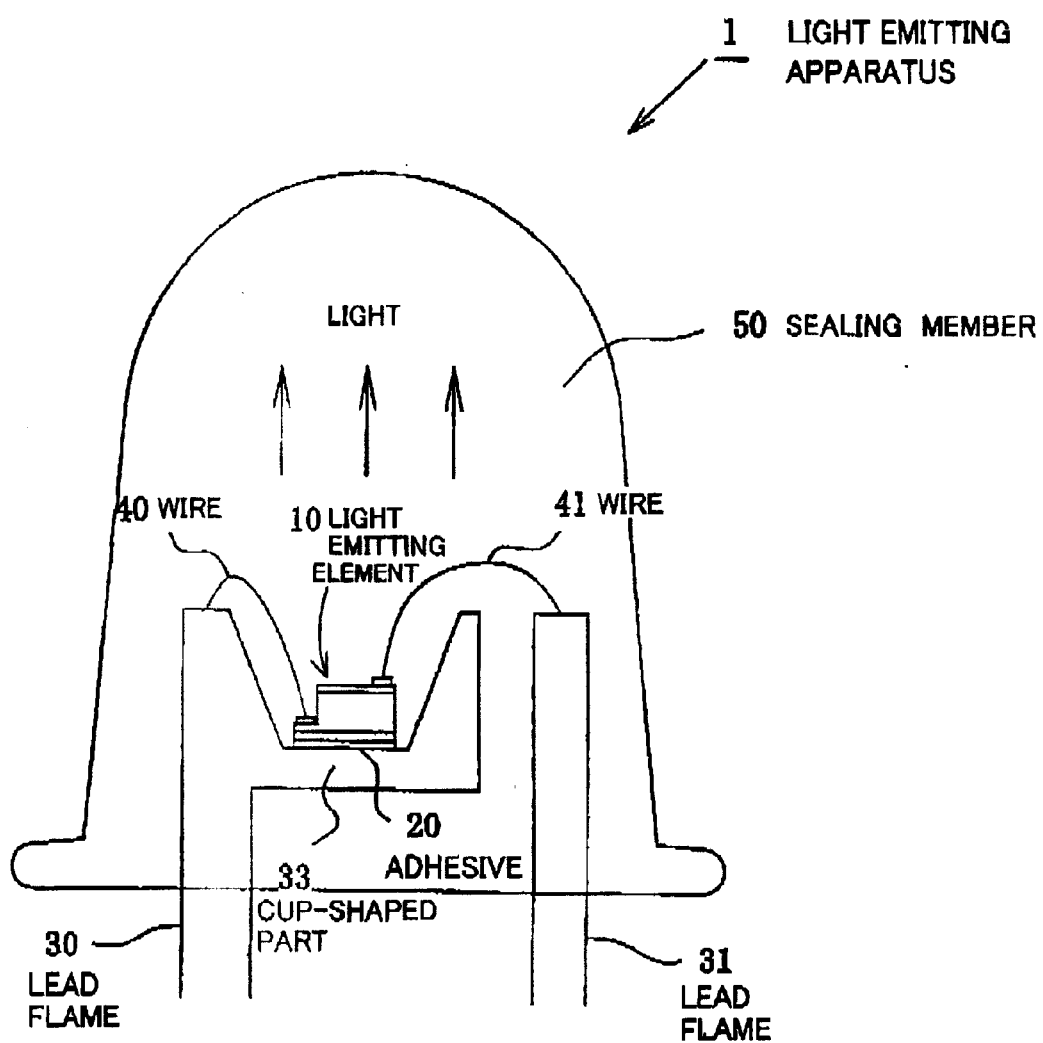
FIG. 2 is a typical cross-sectional view showing the construction of a light emitting apparatus in an embodiment of the invention.

As shown in FIG. 2, a light emitting element 10 is mounted on a cup-shaped part 33 provided in a lead frame 30 with the aid of an adhesive 20. The adhesive 20 is a silver paste produced by mixing silver as a filler into an epoxy resin. The use of the silver paste can improve dissipation of heat from the light emitting element 10. Other conventional adhesives such as transparent pastes and white pastes may be used instead of the silver paste.

A p electrode and an n electrode in the light emitting element 10 are wire bonded to lead frames 31 and 30 through wires 41 and 40, respectively.

This light emitting element 10 was covered with a sealing member 50 prepared in each of the following examples 1–8 and comparative example 1. The light emitting element 10 was continuously energized under conditions of 100° C. and 30 mA. In this case, a change in total luminous flux (retention of total luminous flux) over time was measured for LED 1 shown in FIG. 2. The results are shown in FIG. 3.

Compositions of resins used in the examples 1–8 and the comparative example 1 were as follows. All numeral values are in parts by weight. The compositions are tabulated in FIG. 4.

EXAMPLE 1

An epoxy resin composition of Example 1 is a mixture of bisphenol A, which had been hydrogenated to bring the aromatic double bond to an alicyclic ring (hereinafter referred to as "hydrogenated bis-A"), an alicyclic epoxy having a lower molecular weight than the bis-A, and an acid anhydride as a curing agent. The detailed formulation of the epoxy resin composition is as follows.

| | |
|---|---|
| Epikote YL 6663[1] | 80 |
| CELLOXIDE C 2021 P[2] | 20 |
| PXE-4 ET[3] | 1 |
| Rikacid MH 700 G[4] | 87.5 |

[1] Tradename of hydrogenated bis-A-type epoxy resin, manufactured by Japan Epoxy Resins Co., Ltd.; epoxy equivalent 205 g/eq.
[2] Tradename of aliphatic epoxy resin, manufactured by Daicel Chemical Industries, Ltd.; epoxy 123 g/eq.
[3] Catalyst (tradename of catalyst, manufactured by Sanshin Chemical Industry Co., Ltd.)
[4] Acid anhydride (tradename of acid anhydride, manufactured by New Japan Chemical K.K.)

[Chemical formula 8]

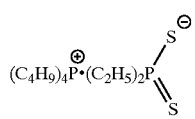

EXAMPLE 2

An epoxy resin composition of Example 2 is the same as the epoxy resin composition of Example 1, except that stabilizers have been additionally mixed into the epoxy resin composition. The details of the stabilizers are as follows.

| | |
|---|---|
| BHT[5] | 0.1 |
| HCA[6] | 0.1 |

[5] Stabilizer (see chemical formula 6)
[6] Stabilizer (see chemical formula 7)

EXAMPLE 3

An epoxy resin composition of Example 3 is the same as the epoxy resin composition of Example 2, except that the mixing ratio of the stabilizers has been changed. The details of the mixing ratio are as follows.

| | |
|---|---|
| BHT | 0.2 |
| HCA | 0.2 |

EXAMPLE 4

An epoxy resin composition of Example 4 is the same as the epoxy resin composition of Example 2, except that the mixing ratio of the stabilizers has been changed. The details of the mixing ratio are as follows.

| | |
|---|---|
| BHT | 2 |
| HCA | 2 |

EXAMPLE 5

An epoxy resin composition of Example 5 is the same as the epoxy resin composition of Example 2, except that the mixing ratio of the stabilizers has been changed. The details of the mixing ratio are as follows.

| | |
|---|---|
| BHT | 4 |
| HCA | 4 |

EXAMPLE 6

An epoxy resin composition of Example 6 is a mixture of a blend of hydrogenated bis-A's different from each other in epoxy equivalent, an alicyclic epoxy having a lower molecular weight than the bis-A's, and an acid anhydride as a curing agent. The detailed formulation of the epoxy resin composition is as follows.

| | |
|---|---|
| Epikote YL 6663 | 40 |
| Epikote YL 6834[7] | 40 |
| CELLOXIDE C 2021 P | 20 |
| PXE-4 ET | 1 |
| Rikacid MH 700 G | 74.5 |
| BHT | 0.2 |
| HCA | 0.2 |

[7] Tradename of hydrogenated bis-A-type epoxy resin, manufactured by Japan Epoxy Resins Co., Ltd.; epoxy equivalent 287 g/eq.

EXAMPLE 7

An epoxy resin composition of Example 7 is the same as the epoxy resin composition of Example 6, except that the mixing ratios of the hydrogenated bis-A's and the acid anhydride have been changed. The details thereof are as follows.

| | |
|---|---|
| Epikote YL 6663 | 0 |
| Epikote YL 6834 | 80 |
| Rikacid MH 700 G | 64.5 |

EXAMPLE 8

An epoxy resin composition of Example 8 is a mixture of hydrogenated bis-A, an acid anhydride as a curing agent, and stabilizers. The detailed formulation of the epoxy resin composition of Example 8 is as follows.

| | |
|---|---|
| Epikote YL 6834 | 100 |
| PXE-4ET | 1 |
| Rikacid MH 700 G | 57.5 |
| BHT | 0.2 |
| HCA | 0.2 |

Comparative Example 1

An epoxy resin composition of Comparative Example 1 is a mixture of bisphenol A (not hydrogenated), an alicyclic epoxy having a lower molecular weight than the bisphenol A, an acid anhydride as a curing agent, and stabilizers. The detailed formulation of the epoxy resin composition of Comparative Example 1 is as follows.

| Epikote 828 EL[8] | 60 |
|---|---|
| CELLOXIDE C 2021 P | 40 |
| PXE-4ET | 1 |
| Rikacid MH 700 G | 100 |
| BHT | 0.1 |
| HCA | 0.1 |

[8]Tradename of bis-A-type epoxy resin, manufactured by Japan Epoxy Resins Co., Ltd.; epoxy equivalent 186 g/eq.

As is apparent from the results shown in FIG. 3, for the epoxy resin in each of the examples, a lowering in retention of the total luminous flux over time is smaller than that for the epoxy resin in the comparative example. In particular, in Examples 6, 7, and 8, there is substantially no lowering in total luminous flux.

Figure 5:
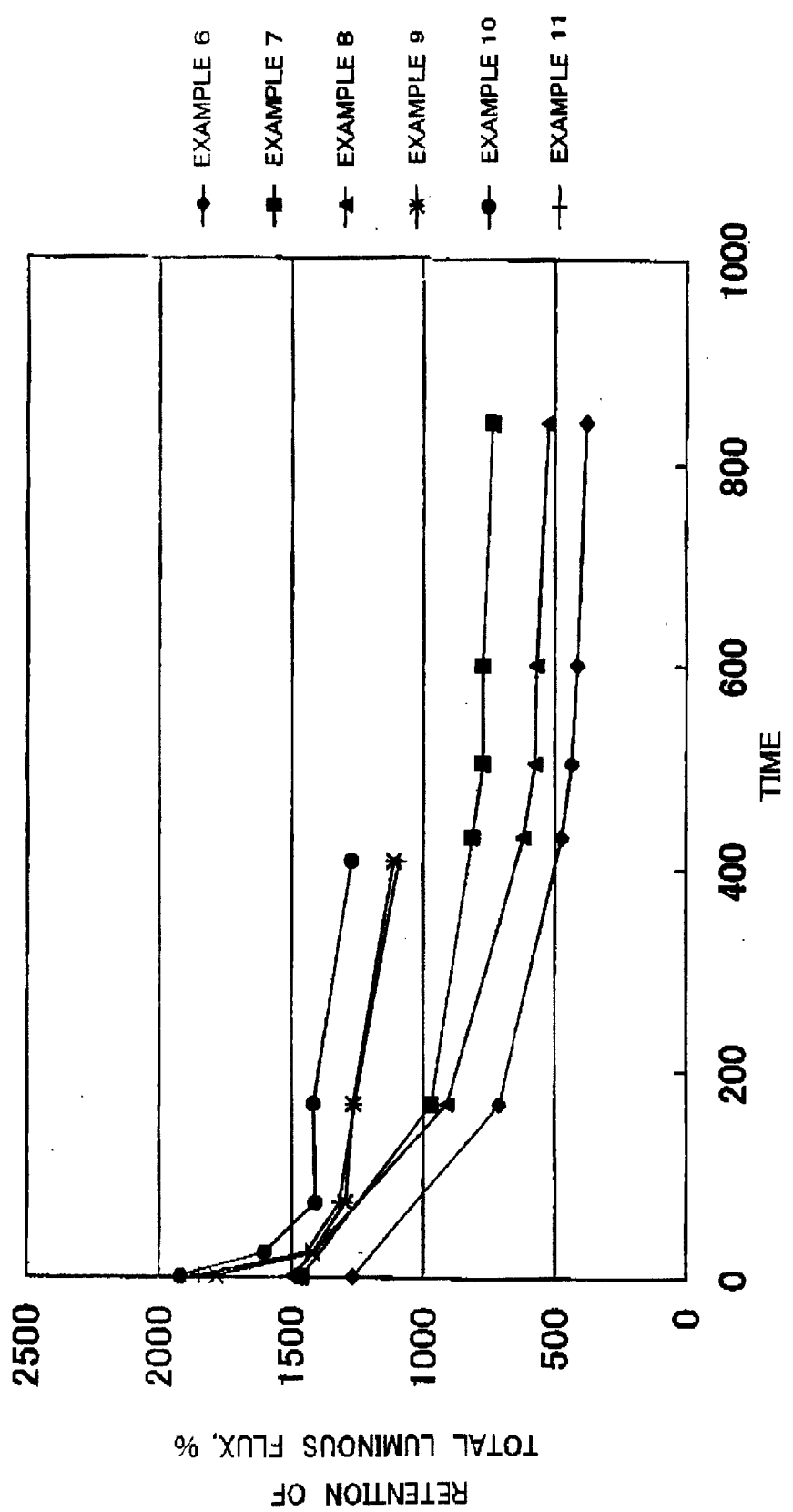
FIG. 5 is a graph showing a change in power of ultraviolet light over time in Examples 6 to 11 of the invention.

The epoxy resin compositions of Examples 6, 7, and 8 were used with an ultraviolet light (peak wavelength: 385 nm) emitting device, and the change in retention of total luminous flux over time was studied. The results are shown in FIG. 5. In the experiment of which the results are shown in FIG. 5, the ultraviolet light emitting element was covered with a sealing member prepared in each of Examples 6, 7, and 8, and the light emitting element was continuously energized under conditions of 100° C. and 30 mA to measure the power of emitted ultraviolet light.

Separately, for Examples 9, 10, and 11 which are the same as Examples 6, 7, and 8 except for the absence of the stabilizer (see table in FIG. 6), the retention of power of emitted ultraviolet light was measured in the same manner as described above.

The results shown in FIG. 5 have revealed that the above stabilizers greatly affect ultraviolet light. This demonstrates that the above stabilizers are not preferably used in sealing members for ultraviolet light emitting elements.

SECOND EXAMPLES

The construction and the effect in another preferred mode of the invention will be explained in more detail in conjunction with the following examples.

Figure 7:
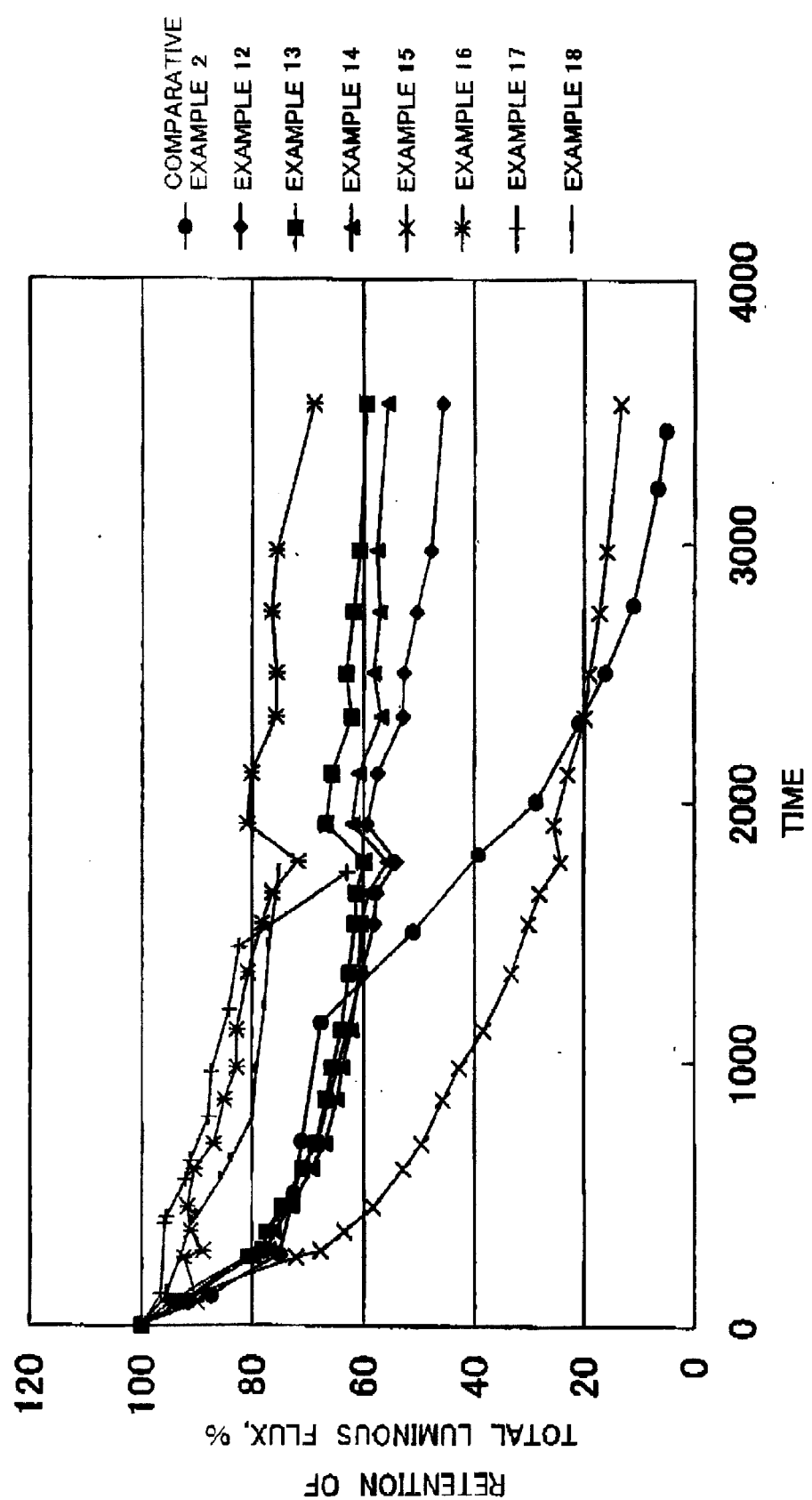
FIG. 7 is a graph showing a change in retention of the total luminous flux over time in Examples 12 to 18 of the invention and Comparative Example 2.

The light emitting element 10 which is the same as the first examples was covered with a sealing member 50 prepared in each of the following examples 12–18 and comparative example 2. The light emitting element 10 was continuously energized under conditions of 100° C. and 30 mA. In this case, a change in total luminous flux (retention of total luminous flux) over time was measured for LED 1 shown in FIG. 2. The results are shown in FIG. 7.

Compositions of resins used in the examples 12–18 and the comparative example 2 were as follows. All numeral values are in parts by weight. The compositions are tabulated in FIG. 8.

EXAMPLE 12

An epoxy resin composition of Example 12 is a mixture of bisphenol A, which had been hydrogenated to bring the aromatic double bond to an alicyclic ring (hereinafter referred to as "hydrogenated bis-A"), an alicyclic epoxy having a lower molecular weight than the bis-A, and a cationic polymerization catalyst as a curing agent. The detailed formulation of the epoxy resin composition is as follows.

| Epikote YL 6663[1] | 80 |
|---|---|
| CELLOXIDE C 2021P[2] | 20 |
| YLH 935[3] | 0.5 |

[1]Tradename of hydrogenated bis-A-type epoxy resin, manufactured by Japan Epoxy Resins Co., Ltd.; epoxy equivalent 205 g/eq.
[2]Tradename of aliphatic epoxy resin, manufactured by Daicel Chemical Industries, Ltd.; epoxy equivalent 123 g/eq.
[3]Cationic polymerization catalyst (tradename of cationic polymerization catalyst, manufactured by Japan Epoxy Resins Co., Ltd.)

EXAMPLE 13

An epoxy resin composition of Example 13 is the same as the epoxy resin composition of Example 12, except that stabilizers have been additionally mixed. The details of the stabilizers are as follows.

| BHT[5] | 0.05 |
|---|---|
| HCA[6] | 0.05 |

[5]Stabilizer (see chemical formula 5)
[6]Stabilizer (see chemical formula 6)

EXAMPLE 14

An epoxy resin composition of Example 14 is the same as the epoxy resin composition of Example 13, except that the mixing ratio of the stabilizers has been changed. The details of the mixing ratio are as follows.

| BHT | 0.1 |
|---|---|
| HCA | 0.1 |

EXAMPLE 15

An epoxy resin composition of Example 15 is the same as the epoxy resin composition of Example 13, except that the mixing ratio of the stabilizers has been changed. The details of the mixing ratio are as follows.

| BHT | 1 |
|---|---|
| HCA | 1 |

EXAMPLE 16

An epoxy resin composition of Example 16 is the same as the epoxy resin composition of Example 13, except that the mixing ratio of the stabilizers has been changed. The details of the mixing ratio are as follows.

| BHT | 2 |
|---|---|
| HCA | 2 |

EXAMPLE 17

An epoxy resin composition of Example 17 is the same as the epoxy resin composition of Example 13, except that the mixing ratio of the stabilizers has been changed. The details of the mixing ratio are as follows.

| | |
|---|---|
| BHT | 2 |
| HCA | 0 |

EXAMPLE 18

An epoxy resin composition of Example 18 is the same as the epoxy resin composition of Example 13, except that the mixing ratio of the stabilizers has been changed. The details of the mixing ratio are as follows.

| | |
|---|---|
| BHT | 0 |
| HCA | 2 |

Comparative Example 2

An epoxy resin composition of Comparative Example 2 is a mixture of bisphenol A (not hydrogenated), an alicyclic epoxy having a lower molecular weight than the bisphenol A, a cationic polymerization catalyst as a curing agent, and stabilizers. The detailed formulation of the epoxy resin composition of Comparative Example 1 is as follows.

| | |
|---|---|
| Epikote 828 EL[8] | 60 |
| CELLOXIDE C 2021P | 40 |
| YLH 935 | 0.5 |
| BHT | 0.1 |
| HCA | 0.1 |

[8]Tradename of bid-A-type epoxy resin, manufactured by Japan Epoxy Resins Co., Ltd.; epoxy equivalent 186 g/eq.

As is apparent from the results shown in FIG. 7, for the epoxy resin in each of the examples 12–18, a lowering in retention of the total luminous flux over time is smaller than that for the epoxy resin in the comparative example 2.

This invention is not limited to the above embodiments and explanation thereof, and variations and modifications can be effected within the scope which does not depart from the description in the claims and can be easily conceived by a person having ordinary skill in the art.

The following items will be disclosed.

(1) The light emitting apparatus according to any of claims 1 to 5, wherein the light emitting element emits a light which has a main emission peak at 550 to 420 nm and the sealing member contains not more than 10% by weight of a stabilizer.

(2) The light emitting apparatus according to any of claims 1 to 5, wherein the light emitting element emits a light which has a main emission peak in an ultraviolet region and the sealing member does not contain any benzene ring-containing stabilizer.

(3) A light emitting apparatus comprising:
a group III nitride compound semiconductor light emitting element; and
a die bonding paste,
said paste comprising
a main agent comprising a first component of an alicyclic epoxy produced by hydrogenating an aromatic epoxy and a second component of an alicyclic epoxy having a lower molecular weight than the first component, the mixing amount of the second component being not less than 10% by weight and less than 30% by weight based on the main agent, and
a curing agent.

(4) The light emitting apparatus according to the above item 3, wherein the curing agent consists essentially of an acid anhydride.

(5) The light emitting apparatus according to the above item 3, wherein the curing agent consists essentially of a cationic polymerization catalyst.

(6) The light emitting apparatus according to any of the above items 3 to 5, wherein the aromatic epoxy is a bisphenol A epoxy.

(7) The light emitting apparatus according to any of the above items 3 to 6, wherein the first component in the main agent has a hydrogenation ratio in an aromatic ring of not less than 85%, a loss ratio of epoxy groups of not more than 20%, and a total chlorine content of not more than 0.3% by weight.

(8) The light emitting apparatus according to any of the above items 3 to 7, wherein the mixing amount of the second component in the main agent is 10 to 25% by weight.

(9) The light emitting apparatus according to any of the above items 3 to 8, wherein the light emitting element emits a light which has a main emission peak wavelength of not more than 550 nm.

(10) The light emitting apparatus according to any of the above items 3 to 9, wherein the light emitting element emits a light which has a main emission peak at 550 to 420 nm and the paste contains not more than 10% by weight of a stabilizer.

(11) The light emitting apparatus according to any of the above items 3 to 10, wherein the light emitting element emits a light which has a main emission peak in an ultraviolet region and the paste does not contain any benzene ring-containing stabilizer.

(12) A sealing member for a light emitting element comprising:
a main agent comprising a first component of an alicyclic epoxy produced by hydrogenating an aromatic epoxy and a second component of an alicyclic epoxy having a lower molecular weight than the first component, the mixing amount of the second component being not less than 10% by weight and less than 30% by weight based on the main agent; and
a curing agent.

(13) The sealing member according to the above item 12, wherein the curing agent consists essentially of an acid anhydride.

(14) The sealing member according to the above item 12, wherein the curing agent consists essentially of a cationic polymerization catalyst.

(15) The sealing member according to any of the above items 12 to 14, wherein the aromatic epoxy is a bisphenol A epoxy.

(16) The sealing member according to any of the above items 12 to 15, wherein the first component in the main agent has a hydrogenation ratio in an aromatic ring of not less than 85%, a loss ratio of epoxy groups of not more than 20%, and a total chlorine content of not more than 0.3% by weight.

(17) The sealing member according to any of the above items 12 to 16, wherein the mixing amount of the second component in the main agent is 10 to 25% by weight.

(18) The sealing member according to any of the above items 12 to 17, wherein the light emitting element emits a light which has a main emission peak wavelength of not more than 550 nm.

(19) The sealing member according to any of the above items 12 to 18, wherein the light emitting element emits a light which has a main emission peak at 550 to 420 nm and the sealing member contains not more than 10% by weight of a stabilizer.

(20) The sealing member according to any of the above items 12 to 19, wherein the light emitting element emits a light which has a main emission peak in an ultraviolet region and the sealing member does not contain any benzene ring-containing stabilizer.

(21) A paste for die bonding of a light emitting element comprising:

a main agent comprising a first component of an alicyclic epoxy produced by hydrogenating an aromatic epoxy and a second component of an alicyclic epoxy having a lower molecular weight than the first component, the mixing amount of the second component being not less than 10% by weight and less than 30% by weight based on the main agent; and a curing agent.

(22) The paste for die bonding of a light emitting element according to the above item 21, wherein the curing agent consists essentially of an acid anhydride.

(23) The paste for die bonding of a light emitting element according to the above item 21, wherein the curing agent consists essentially of a cationic polymerization catalyst.

(24) The paste for die bonding of a light emitting element according to any of the above items 21 to 23, wherein the aromatic epoxy is a bisphenol A epoxy.

(25) The paste for die bonding of a light emitting element according to any of the above items 21 to 24, wherein the first component in the main agent has a hydrogenation ratio in an aromatic ring of not less than 85%, a loss ratio of epoxy groups of not more than 20%, and a total chlorine content of not more than 0.3% by weight.

(26) The paste for die bonding of a light emitting element according to any of the above items 21 to 25, wherein the mixing amount of the second component in the main agent is 10 to 25% by weight.

(27) The paste for die bonding of a light emitting element according to any of the above items 21 to 26, wherein the light emitting element emits a light which has a main emission peak wavelength of not more than 550 nm.

(28) The paste for die bonding of a light emitting element according to any of the above items 21 to 27, wherein the light emitting element emits a light which has a main emission peak at 550 to 420 nm and the sealing member contains not more than 10% by weight of a stabilizer.

(29) The paste for die bonding of a light emitting element according to any of the above items 21 to 28, wherein the light emitting element emits a light which has a main emission peak in an ultraviolet region and the sealing member does not contain any benzene ring-containing stabilizer.

What is claimed is:

1. A light emitting apparatus comprising:

a group III nitride compound semiconductor light emitting element; and a sealing member for covering the light emitting element on its light emission side, said sealing member comprising a main agent comprising a first component of an alicyclic epoxy produced by hydrogenating an aromatic epoxy and a second component of an alicyclic epoxy having a lower molecular weight than the first component, the mixing amount of the second component being not less than 10% by weight and less than 30% by weight based on the main agent, and a curing agent.

2. The light emitting apparatus according to claim 1, wherein the curing agent consists essentially of an acid anhydride.

3. The light emitting apparatus according to claim 1, wherein the curing agent consists essentially of a cationic polymerization catalyst.

4. The light emitting apparatus according to claim 1, wherein the aromatic epoxy is a bisphenol A epoxy.

5. The light emitting apparatus according to claim 1, wherein the first component in the main agent has a hydrogenation ratio in an aromatic ring of not less than 85%, a loss ratio of epoxy groups of not more than 20%, and a total chlorine content of not more than 0.3% by weight.

6. The light emitting apparatus according to claim 1, wherein the mixing amount of the second component in the main agent is 10 to 25% by weight.

7. The light emitting apparatus according to claim 1, wherein the light emitting element emits a light which has a main emission peak wavelength of not more than 550 nm.

8. The light emitting apparatus according to claim 1, wherein the light emitting element emits a light which has a main emission peak at 550 to 420 nm and the sealing member contains not more than 10% by weight of a stabilizer.

9. The light emitting apparatus according claim 1, wherein the light emitting element emits a light which has a main emission peak in an ultraviolet region and the sealing member does not contain any benzene ring-containing stabilizer.

10. A light emitting apparatus comprising:

a group III nitride compound semiconductor light emitting element; and a paste for fixing a substrate of the light emitting element, said paste comprising a main agent comprising a first component of an alicyclic epoxy produced by hydrogenating an aromatic epoxy and a second component of an alicyclic epoxy having a lower molecular weight than the first component, the mixing amount of the second component being not less than 10% by weight and less than 30% by weight based on the main agent, and a curing agent.

11. The light emitting apparatus according to claim 10, wherein the curing agent consists essentially of an acid anhydride.

12. The light emitting apparatus according to claim 10, wherein the curing agent consists essentially of a cationic polymerization catalyst.

13. A sealing member for a light emitting element comprising:

a main agent comprising a first component of an alicyclic epoxy produced by hydrogenating an aromatic epoxy and a second component of an alicyclic epoxy having a lower molecular weight than the first component, the mixing amount of the second component being not less than 10% by weight and less than 30% by weight based on the main agent; and a curing agent.

14. The sealing member for a light emitting element according to claim 13, wherein the curing agent consists essentially of an acid anhydride.

15. The sealing member for a light emitting element according to claim 13, wherein the curing agent consists essentially of a cationic polymerization catalyst.

16. The sealing member for a light emitting element according to claim 13, wherein the aromatic epoxy is a bisphenol A epoxy.

17. The sealing member for a light emitting element according to claim 13, wherein the first component in the main agent has a hydrogenation ratio in an aromatic ring of not less than 85%, a loss ratio of epoxy groups of not more than 20%, and a total chlorine content of not more than 0.3% by weight.

18. The sealing member for a light emitting element according to claim 13, wherein the mixing amount of the second component in the main agent is 10 to 25% by weight.

19. The sealing member for a light emitting element according to claim 13, wherein the light emitting element emits a light which has a main emission peak at 550 to 420 nm and the sealing member contains not more than 10% by weight of a stabilizer.

20. The sealing member for a light emitting element according to claim 13, wherein the light emitting element emits a light which has a main emission peak in an ultraviolet region and the sealing member does not contain any benzene ring-containing stabilizer.

* * * * *